US006698008B2

(12) United States Patent
McCullen et al.

(10) Patent No.: US 6,698,008 B2
(45) Date of Patent: Feb. 24, 2004

(54) ROW-BASED PLACEMENT SCORING AND LEGALIZATION MEASURE FOR BOOKS WITH PHASE SHIFT MASK DEPENDENCIES

(75) Inventors: Kevin W. McCullen, Essex Junction, VT (US); Ivan L. Wemple, Shelburne, VT (US)

(73) Assignee: International Business Machines Corporation, Armonk, NY (US)

( * ) Notice: Subject to any disclaimer, the term of this patent is extended or adjusted under 35 U.S.C. 154(b) by 142 days.

(21) Appl. No.: 10/016,207

(22) Filed: Oct. 30, 2001

(65) Prior Publication Data

US 2003/0084419 A1 May 1, 2003

(51) Int. Cl.$^7$ ............................................. G06F 17/50
(52) U.S. Cl. ............................. 716/19; 716/21; 716/20; 430/5
(58) Field of Search ......................... 716/19–21; 430/5

(56) References Cited

U.S. PATENT DOCUMENTS

| 5,441,834 | A | | 8/1995 | Takekuma et al. ............. 430/5 |
|---|---|---|---|---|
| 5,537,648 | A | | 7/1996 | Liebmann et al. ........... 395/500 |
| 5,636,131 | A | | 6/1997 | Liebmann et al. ........... 364/490 |
| 5,663,893 | A | | 9/1997 | Wampler et al. ............. 364/491 |
| 5,867,401 | A | | 2/1999 | Haruki ........................ 364/490 |
| 5,923,566 | A | | 7/1999 | Galan et al. ................. 364/489 |
| 5,935,735 | A | * | 8/1999 | Okubo et al. .................. 430/5 |
| 6,057,063 | A | * | 5/2000 | Liebmann et al. .............. 430/5 |
| 6,083,275 | A | * | 7/2000 | Heng et al. .................... 716/19 |
| 6,153,342 | A | * | 11/2000 | Doyle et al. .................... 430/5 |
| 6,185,727 | B1 | | 2/2001 | Liebmann ....................... 716/19 |
| 6,503,666 | B1 | * | 1/2003 | Pierrat .......................... 430/5 |
| 6,524,751 | B1 | * | 2/2003 | Stanton et al. ................. 430/5 |
| 2002/0155363 | A1 | * | 10/2002 | Cote et al. ..................... 430/5 |

OTHER PUBLICATIONS

Kahng et al., "New Graph Bipartitions for Double–Exposure, Bright Field Alternating Phase–Shift Mask Layout," IEEE, Feb. 2, 2001, pp. 133–138.*
Berman et al., "Optimal Phase Conflict Removal for Layout of Dark Field Alternating Phase Shifting Masks," IEEE, Feb. 2000, pp. 175–187.*
Wong et al., "Investigating Phase–Shifting Mask Layout Issues Using a CAD Toolkit," IEEE, 1991, pp. 27.4.1–27.4.4.*

* cited by examiner

Primary Examiner—Vuthe Siek
(74) Attorney, Agent, or Firm—McGinn & Gibb, PLLC; Richard M. Kotulak, Esq.

(57) ABSTRACT

A method and structure for checking legality of books in a phase-shift circuit design mask which arranges the books in rows, determines a book polarity of phase shift mask features of each of the books, sums polarities of the books within each of the rows to produce a row polarity of phase shift mask features of the row, checks whether the row polarity complies with legal requirements of the circuit design, and modifies placement of the books until all of the rows comply with the legal requirements.

20 Claims, 4 Drawing Sheets

ROW-BASED PLACEMENT SCORING AND LEGALIZATION MEASURE FOR BOOKS WITH PHASE SHIFT MASK DEPENDENCIES

BACKGROUND OF THE INVENTION

1. Field of the Invention

The present invention generally relates to strategies for placement of phase shift masks and more particularly to an improved system that uses row parity to determine whether an ASIC book is placed legally within a circuit.

2. Description of the Related Art

Manufacturing of semiconductor devices is dependent upon the accurate replication of computer aided design (CAD) generated patterns onto the surface of a device substrate. The replication process is typically performed using optical lithography followed by a variety of subtractive (etch), additive (deposition) and material modification (e.g., oxidations, ion implants, etc.) processes. Optical lithography patterning involves the illumination of a metallic coated quartz plate known as a photomask which contains a magnified image of the computer generated pattern etched into the metallic layer. This illuminated image is reduced in size and patterned into a photosensitive film on the device substrate. As a result of the interference and processing effects which occur during pattern transfer, images formed on the device substrate deviate from their ideal dimensions and shape as represented by the computer images. These deviations depend on the characteristics of the patterns as well as a variety of process conditions. Because these deviations can significantly effect the performance of the semiconductor device, many approaches have been pursued which focus on CAD compensation schemes which ensure a resultant ideal image.

Conventional photomasks consist of chromium patterns on a quartz plate, allowing light to pass wherever the chromium is removed from the mask. Light of a specific wavelength is projected through the mask onto a photoresist coated wafer, exposing the resist wherever transparent patterns appear on the mask. Exposing the resist to light of the appropriate wavelength causes modifications in the molecular structure of the resist polymers which allows developer to dissolve and remove the resist in the exposed areas. The photomask, when illuminated, can be pictured as an array of individual, infinitely small light sources which can either be turned on (points in clear areas) or turned off (points covered by chrome). If the amplitude of the electric field vector which describes the light radiated by these individual light sources is mapped across a cross section of the mask, a step function will be plotted reflecting the two possible states in which each point on the mask can be found (light on, light off).

These conventional photomasks are commonly referred to as chrome on glass (COG) binary masks, due to the binary nature of the image amplitude. The perfectly square step function exists only in the theoretical limit of the exact mask plane. At any distance away from the mask, such as in the wafer plane, diffraction effects will cause images to exhibit a finite image slope. At small dimensions, that is, when the size and spacing of the images to be printed are small relative to the ratio of the wavelength, λ, to the numerical aperture, NA, of the exposure system, electric field vectors of adjacent images will interact and add constructively. The resulting light intensity curve between the features is not completely dark, but exhibits significant amounts of light intensity created by the interaction of adjacent features. This resolution of an exposure system is limited by the contrast of the projected image; that is, the intensity difference between adjacent light and dark features. An increase in the light intensity in nominally dark regions will eventually cause adjacent features to print as one combined structure rather than discrete images.

The quality with which small images can be replicated in lithography depends largely upon the available process latitude; that is, the amount of allowable dose and focus variation that still results in correct image size. Phase shifted mask (PSM) lithography improves the lithographic process latitude by introducing a third parameter on the mask. The electric field vector, like any vector quantity, has a magnitude and direction; so, in addition to turning the electric field amplitude on and off, it can be turned on with a 0° phase or turned on with a 180° phase. This phase variation is achieved in PSMs by modifying the length that a light beam travels through the mask material. By recessing the mask by the appropriate depth, light traversing the thinner portion of the mask and light traversing the thicker portion of the mask will be 180° out of phase; that is, their electric field vectors will be of equal magnitude but point in exactly opposite directions so that any interaction between these light beams results in perfect cancellation.

Phase edge PSM lithography makes use of contrast enhancement afforded by a phase transition under a narrow opaque feature on the mask. This phase transition is caused by an appropriate difference in the path length of the light in the quartz mask substrate on either side of the narrow opaque feature. The path length difference is achieved on the PSM by either depositing or removing transparent mask material selectively on one side of the narrow opaque feature. The asymmetric nature of this mask topography modification forces a deliberate second patterning operation to define areas in which material is to be removed or deposited after the opaque patterns have been formed in the metallic mask coating with a first patterning operation. The complexity of the design of these phase regions in which the mask topography is to be modified has been one of the major inhibitors for full scale insertion into VLSI manufacturing. Recently, patterns of semiconductor integrated circuits have become smaller, and there are demands to improve the focal depth and the resolution of the exposure.

An amplitude of monochromatic light transmitted through aperture patterns 2 and 4 of a photomask 1 shown in FIG. 1A and an amplitude of monochromatic light transmitted through aperture patterns 3 and 5 of the photomask 1, respectively, become as indicated by Ø1 and Ø2 on a semiconductor waver, as shown in FIG. 1B. In this case, a light intensity becomes proportional to $|Ø+Ø2|^2$ as shown in FIG. 1C. The lights transmitted through the aperture patterns 2 through 5 are diffracted, and interfere so as to intensify each other between the adjacent exposure patterns, thereby causing the resolution of the exposure to deteriorate. This problem of deteriorating resolution of exposure becomes more conspicuous as the patterns become smaller.

Hence, as shown in FIG. 1D, there is a technique to eliminate the above-described problem by arranging phase shifters (of phase shift layers) 6 and 7 over the corresponding aperture patterns 3 and 5 of a photomask 1A. In this case, the lights transmitted through adjacent aperture patterns have a phase difference of π radians, so that the transmitted lights interfere and weaken each other. The monochromatic light transmitted through the aperture patterns 3 and 5 have an amplitude −Ø2 shown in FIG. 1E. In addition, the light intensity becomes proportional to $|Ø1+Ø2|^2$ as shown in FIG. 1F. Hence, the resolution of the exposure is improved and the focal depth is also improved by the provision of the phase shifters 6 and 7.

SUMMARY OF THE INVENTION

A large number of aperture patterns are arranged two-dimensionally on the photomask. In general, it is therefore impossible to arrange the phase shifter on only one of the two mutually adjacent aperture patterns with respect to all of the mutually adjacent aperture patterns. In addition, when 1000 aperture patterns exist, for example, there are 2999 different ways to arrange the phase shifters. It is difficult, even by use of a computer, to find an optimum solution.

As a result, attention has shifted toward efficient verification of the automatically generated designs. Design errors can lead to the creation and use of defective masks by eliminating the phase transition, either by placing a 180° phase region on both sides of the critical feature, or by completely omitting the phase region adjacent to certain features.

In view of the foregoing and other problems, disadvantages, and drawbacks of the conventional phase shift mask placement systems, the present invention has been devised, and it is an object of the present invention to provide a structure and method for an improved phase shift mask placement system that uses parity checks on the rows of application-specific integrated circuit (ASIC) books to determine legal book placement.

In order to attain the object(s) suggested above, there is provided, according to one aspect of the invention, a method for checking legality of books in a phase shift circuit design mask which arranges the books in rows, determines a book polarity of phase shift mask features of each of the books, sums polarities of the books within each of the rows to produce a row polarity of phase shift mask features of the row, checks whether the row polarity complies with legal requirements of the circuit design, and modifies placement of the books until all of the rows comply with the legal requirements. The invention also comprises placing a spacer between books in a row to correct a row that does not comply with the legal requirements. The spacer divides a row into sub-rows.

Each book comprises an ASIC circuit cell which implements a logical function. A book has a first polarity if ends of the book have the same phase shift, and a second polarity if ends of the book have different phase shifts. An odd or even nature of the row polarity indicates whether the row has the same or different phase shifts at the ends of the row. Further, the invention inserts a book between sub-rows to create a larger row and repeats the summing and the checking on the larger row.

The invention provides a scoring method for book placement which very easily and quickly identifies whether a row of books have a legal placement utilizing a parity scheme that quickly determines whether the relative polarity of adjacent books combine to produce a total row parity that complies with designer requirements. Therefore, the invention avoids the time-consuming manual process of determining whether automatically placed books comply with design requirements (whether they are legal). In addition, the process of using parities to check the legality of book placement is faster than conventional systems (because parity checking is a computationally easy process). This allows the present invention to be more accurate than conventional systems because every aspect of the design can be checked, and the design can easily and quickly be checked and rechecked at any point (even after slight modifications).

BRIEF DESCRIPTION OF THE DRAWINGS

The foregoing and other objects, aspects and advantages will be better understood from the following detailed description of a preferred embodiment(s) of the invention with reference to the drawings, in which.

DETAILED DESCRIPTION OF PREFERRED EMBODIMENTS OF THE INVENTION

This invention provides a system and method for determining whether placement of a row of ASIC books is legal, and identifies where to place spacers to make a row legal. This is especially important when the books themselves have shapes which require Phase-Shift-Mask (PSM) features which are placed so close to the book boundary that neighboring books must have compatible PSM structures.

An ASIC "book" is a series of devices (conductive shapes) that perform a specific logical function. Such "books" are usually designed and tested/perfected once, and are then stored in a library so that they can be used in many different designs. It is much more efficient for a designer to simply select an ASIC book from a library, whenever the designer needs a specific logic operation achieved, as opposed to creating the logic individually each time such an operation is needed.

Figure 1A:
FIGS. 1A–1F are schematic diagrams of structures using phase shift masks.
Figure 1B:
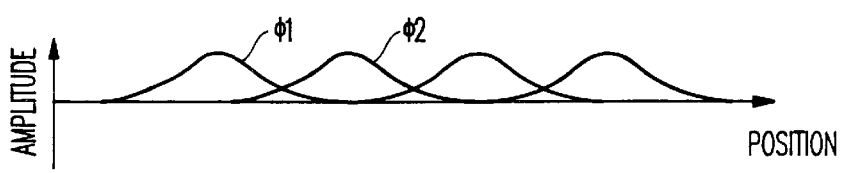
Figure 1C:
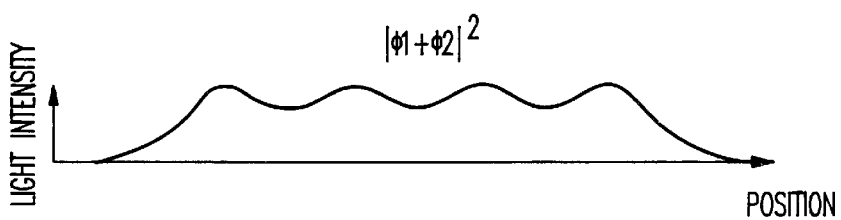
Figure 1D:
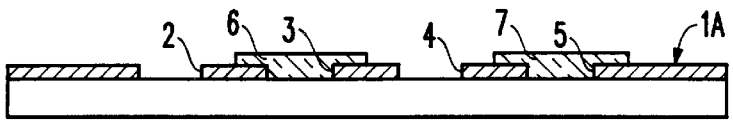
Figure 1E:
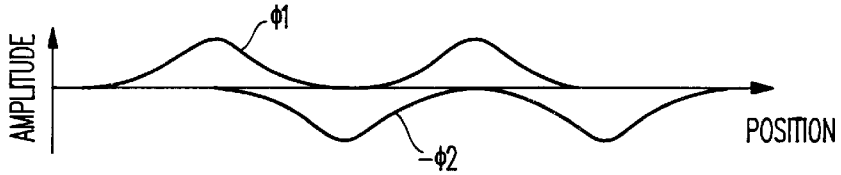
Figure 1F:
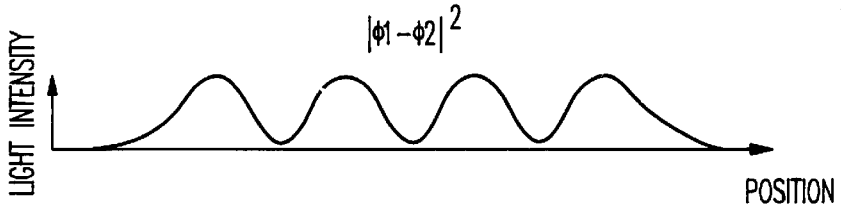
Figure 2:
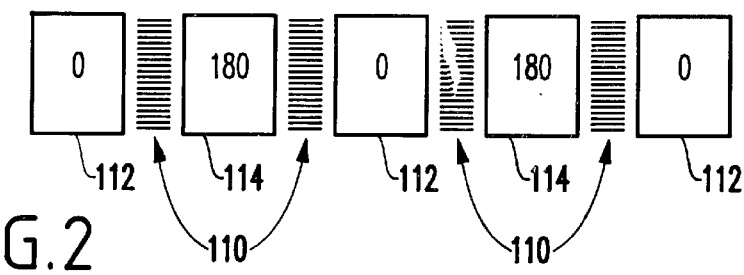
FIG. 2 is a schematic diagram of an ASIC book containing metal shapes and phase shift masks.
Figure 3:
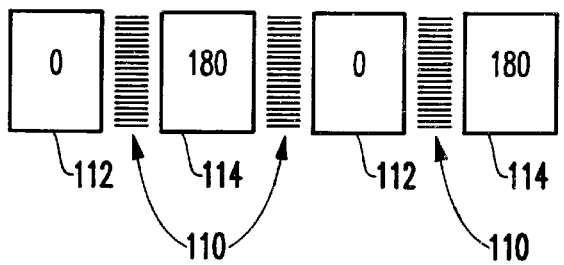
FIG. 3 is a schematic diagram of an ASIC book containing metal shapes and phase shift masks.

Two conceptual PSM masks for ASIC books (or portions of ASIC books) are shown in FIGS. 2 and 3. In each, items 110 represent conductive shapes and items 112, 114 represent the phase shift masks. As discussed above, the phase shift masks include sections that do not perform phase shift 112 and sections that perform a complete (180°) phase shift 114.

When performing placement of such ASIC books within a row of circuits, it is necessary to know whether the books which have been placed are "legal" (meaning that valid phase assignments can be made), or whether they will be legal after a new placement is made (a book is inserted or deleted from the row). Because of the nature of the placement problem (a very computationally intensive problem), it is imperative that this problem be solved very efficiently.

To solve this problem, the invention provides a scoring method for book placement which very easily and quickly identifies whether a row of books have a legal placement. Note that this applies to the situation where there are fixed structures (such as a pre-placed book) at the ends of the row. In the situation where the row is unrestricted at the ends, the books can be packed edge- to-edge without any phase assignment difficulties.

The scoring method used by the invention is "parity." The "parity" of a book is 0 (zero) if the left and right edges of the book require the same phase (there are an even number of phase changes within the book), as shown in FIG. 2. The "parity" of a book is 1 (one) if the left and right edges of the book require different phase structures (there are an odd number of phase changes within the book) as shown in FIG. 3. Note that in FIG. 2, 0° phase shift masks 112 are at both ends of the book (zero parity), while in FIG. 3, one 0° phase shift mask 112 is at one end while one 180° phase shift mask 114 is at the other end of the book (one parity).

Figure 4:
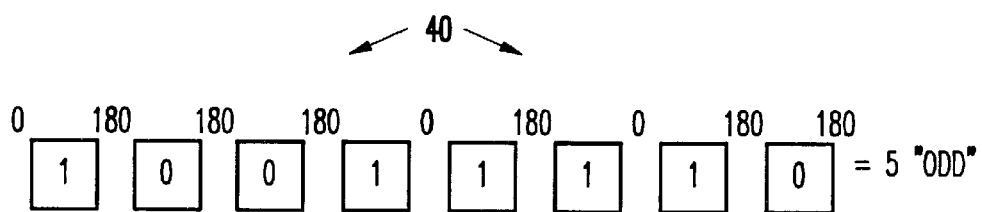
FIG. 4 is a schematic diagram of a row of ASIC books.
Figure 5:
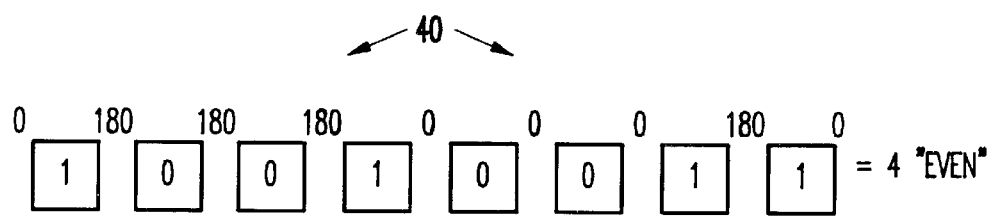
FIG. 5 is a schematic diagram of a row of ASIC books.

With the invention, for any length row of books, if the sum of the parities is even, the row begins and ends with the same phase, as shown in FIG. 4. If the sum of the parities is odd, the row begins and ends on different phases, as shown in FIG. 5. More specifically, FIG. 4 illustrates a series of books 40 (each of which is identified as an "odd" book (0) or an "even" book (1) to indicate whether the phase shift masks will be the same or different at the ends of each book. The polarity of the phase shift mask at the end of each mask is also shown at 0° or 180° for the phase shift masks at the end of each book. The actual polarity may not be known at the time of the application of this invention; however, potential phases of the mask regions are shown only to aid in the understanding of the operation of the invention. Indeed, in practice, the actual phases of each individual mask region will be made later. After phase assignment, the books will still comply with the foregoing rules and will maintain the same patterns of phase change as shown in the drawings.

Proceeding from left to right across the row of books shown in FIG. 4, the phase assignment for the mask region at the outer edge of the first book arbitrarily begins at 0. Since the first book (1) is an odd book, it will have a 180° phase shift mask. The second book (0) in the row is an even book and has the 180° phase shift at both ends. The next book (0) similarly has 180° phase shift masks at both ends. The next four books (1) change the polarity of the end masks 4 times, and the final book (1) retains the same phase shift. Adding up the 0 and 1 books results in an odd total (5), indicating that the row of books will have different phase shift masks at the ends. In the context of the fixed end books (90), books 90 may be pre-designed with phases already assigned. The "end conditions" for the row are then pre-determined.

FIG. 5 similarly shows a row of books 40 where the total is even (4). Thus, the changes in end phase shift masks of the books within the row results in the beginning and ending having the same phase change mask. The circuit designer will mandate whether a given row of books should have an overall odd or even pattern. If the designer required an odd row, but the row was as shown in FIG. 5, an adjustment would have to be made to correct the row. The invention provides such an adjustment in the form of a spacer 60, as shown in FIG. 6.

Figure 6:
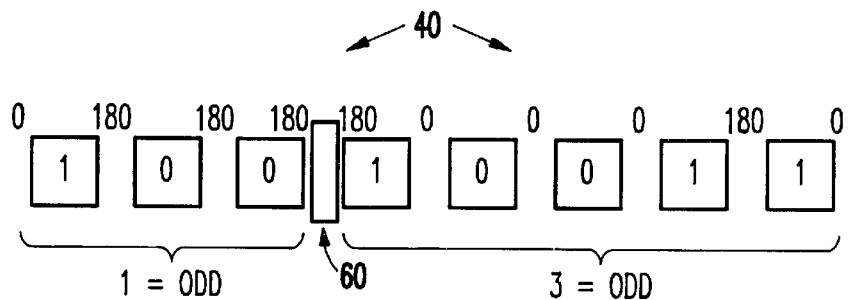
FIG. 6 is a schematic diagram of a row of ASIC books.

More specifically, FIG. 6 shows the same row of books 40 as in FIG. 5; however, with the use of the spacer 60, instead of having a single even row (4), two odd sub-rows (1, 3) have been created. The first odd sub-row has one odd book and two even books (for an odd total (1)) and the second odd sub-row has three odd books and two even books (for an odd total (3)). In other words, if the row parities do not match, then a spacer must be inserted into the row. The spacer can be inserted at any location which creates two sub-rows (to the left and right of the spacer) that have the required parities. Therefore, the invention can modify any row to make it comply with design requirements (and to make sure that the row is legal). A spacer is a "cell" with no "design" or "logic." Since there is no logic, no phase shapes are required. If two phase shapes are far enough apart, then their phases do not need to be consistent. Hence, the invention can break the parity counting at a spacer.

Figure 7:
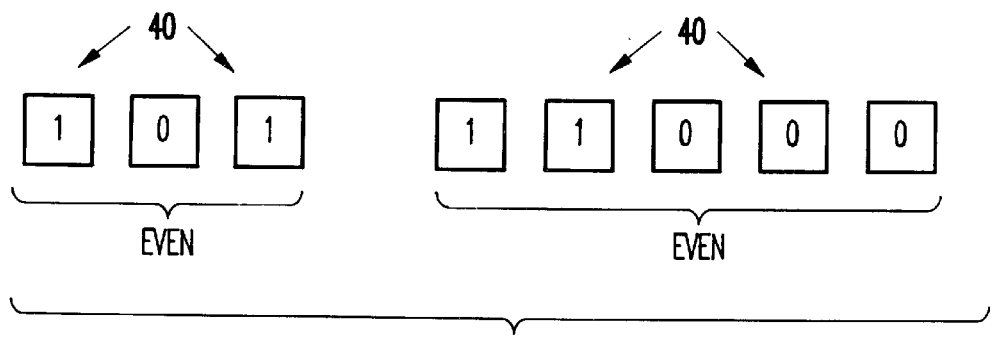
FIG. 7 is a schematic diagram of a row of ASIC books.
Figure 8:
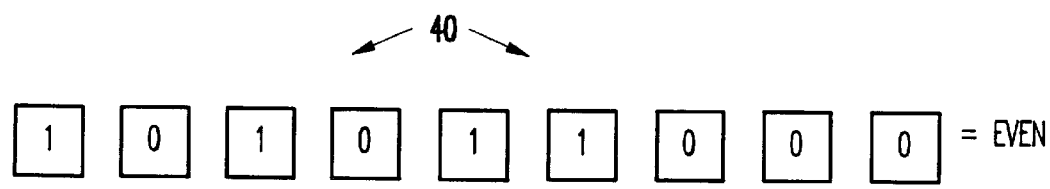
FIG. 8 is a schematic diagram of a row of ASIC books.

FIGS. 7 and 8 illustrate a situation where a book is inserted into a row. More specifically, FIG. 7 shows two sub-rows, both of which are even. In FIG. 8, a new book 80 is inserted between the sub-rows. In order to maintain the designer's requirement that the row total be even, the newly-added book 80 is an even (0) book. Therefore, the invention allows books to be added to rows (or between sub-rows to create a larger row), while at the same time maintaining the legality of the larger row created. Regardless of the polarity of a row, inserting 1 even polarity or 2 odd polarity books will leave the polarity unchanged.

Figure 9:
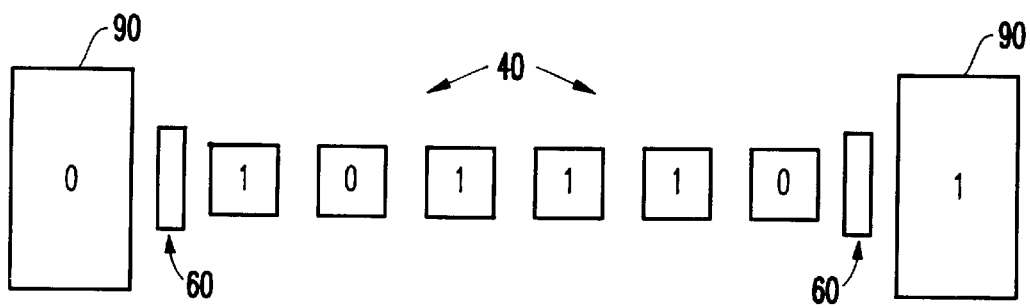
FIG. 9 is a schematic diagram of a row of ASIC books.

In FIG. 9, when fixed objects 90 are present (i.e., those with predetermined phase assignments at their boundaries), they often represent pre-designed cores and/or macros. Thus, they are typically larger than the standard-cell books associated with the placement process. In other words, there are far fewer fixed objects than there are placeable standard cell books.

Moreover, as shown in FIG. 9, all of the row-based logic designs contain regions of unutilized silicon because the chip wiring always requires additional area above and beyond that associated with the circuit area itself. In other words, due to wireability constraints, "empty" space is a common (if not abundant) characteristic of row-based book placements.

An additional aspect of this invention can be exploited to provide additional efficiency for circuit placement involving PSM library cells. That is, by always adding spacers 60 at the boundaries of pre-placed "fixed" objects, for any circuit row inserted between fixed objects, their boundaries automatically become "unrestricted" with respect to phase assignment. The pre-assigned spacers 60 will ensure that phase conflicts are never present at the boundaries of the fixed structures 90.

Figure 11:
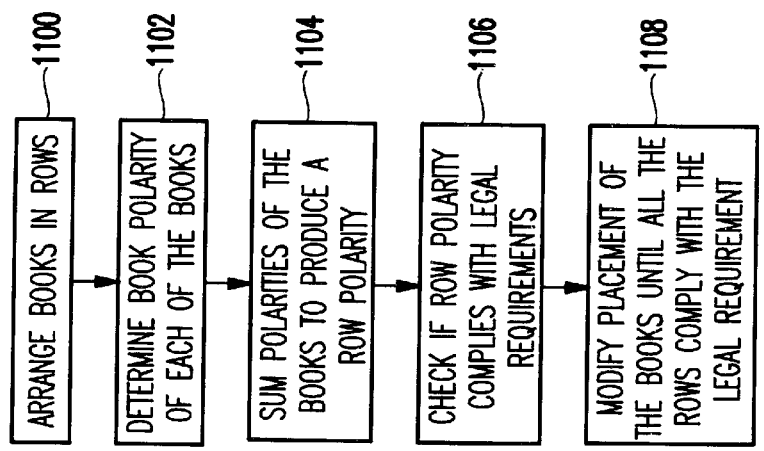
FIG. 11 is a flow diagram illustrating a preferred method of the invention.
Figure 10:
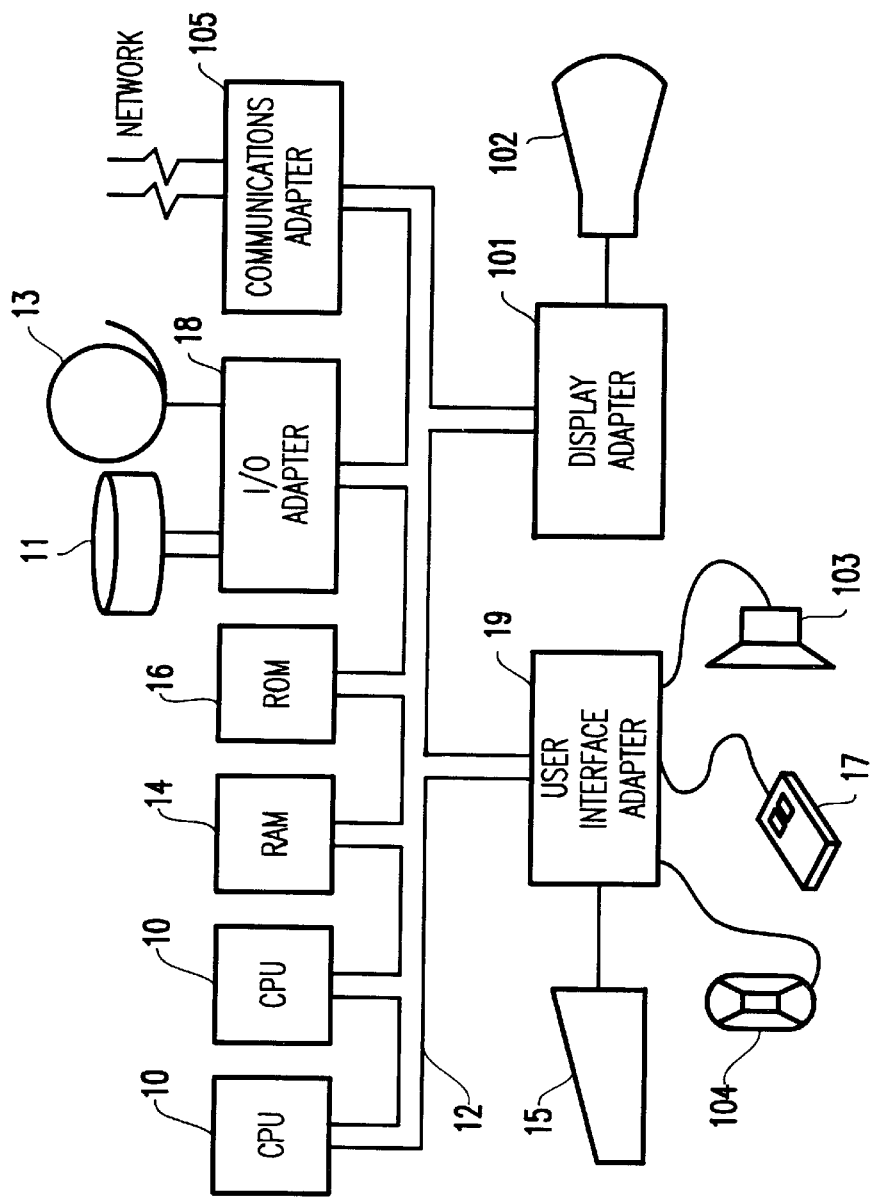
FIG. 10 is a hardware diagram of a system used to implement the invention.

A representative hardware environment for practicing the present invention is depicted in FIG. 10, which illustrates a typical hardware configuration of an information handling/computer system in accordance with the subject invention, having at least one processor or central processing unit (CPU) 10. CPUs 10 are interconnected via system bus 12 to random access memory (RAM) 14, read-only memory (ROM) 16, an input/output (I/O) adapter 18 for connecting peripheral devices, such as disk units 11 and tape drives 13, to bus 12, user interface adapter 19 for connecting keyboard 15, mouse 17, speaker 103, microphone 104, and/or other user interface devices such as touch screen device (not shown) to bus 12, communication adapter 105 for connecting the information handling system to a data processing network, and display adapter 101 for connecting bus 12 to display device 102. A program storage device readable by the disk or tape units is used to load the instructions which operate on the invention which is also loaded onto the computer system The inventive process is shown in flowchart form in FIG. 11. More specifically, item 1100 first arranges the books in rows. Then, the invention in item 1102 determines a book polarity of each of the books. Item 1104 sums polarities of the books to produce a row polarity. In item 1106, the invention checks whether the row polarity complies with legal requirements. Finally, in item 1108, the invention modifies placement of the books until all of the rows comply with the legal requirements.

Thus, the invention provides a scoring method for book placement which very easily and quickly identifies whether a row of books has a legal placement utilizing a parity scheme that quickly determines whether the relative polarity of adjacent books combine to produce a total row parity that complies with designer requirements. Therefore, the invention avoids the time-consuming manual process of determining whether automatically placed books comply with design requirements (whether they are legal). In addition, the process of using parities to check the legality of book placement is faster than conventional systems (because parity checking is a computationally easy process). This allows the invention to be more accurate than conventional systems because every aspect of the design can be checked, and the design can easily and quickly be checked and rechecked at any point (even after slight modifications).

While the invention has been described in terms of preferred embodiments, those skilled in the art will recognize that the invention can be practiced with modification within the spirit and scope of the appended claims.

What is claimed is:

1. A method for checking legality of books in a phase-shift circuit design mask comprising:

arranging said books in rows;

determining a book polarity of each of said books;

summing polarities of said books within each of said rows to produce a row polarity; and checking whether said row polarity complies with legal requirements of said circuit design.

2. The method in claim 1, further comprising placing a spacer between books in a row to correct a row that does not comply with said legal requirements.

3. The method in claim 1, further comprising always adding spacers at boundaries of pro-placed fixed objects, for any circuit row inserted between said fixed objects.

4. The method in claim 1, wherein said books comprise application-specific integrated circuit (ASIC) books of a logical function.

5. The method in claim 1, wherein a book has a first polarity if ends of said book have the same phase shift, and a second polarity if ends of said book have different phase shifts.

6. The method in claim 1, wherein an odd or even nature of said row polarity indicates whether said row has the same or different phase shifts at ends of said row.

7. The method in claim 1, further comprising inserting a book between sub-rows to create a larger row and repeating said summing and said checking on said larger row.

8. A method for checking legality of books in a phase-shift circuit design mask comprising:

arranging said books in rows;

determining a book polarity of phase shift mask features of each of said books;

summing polarities of said books within each of said rows to produce a row polarity of phase shift mask features of said row;

checking whether said row polarity complies with legal requirements of said circuit design; and modifying placement of said books until all of said rows comply with said legal requirements.

9. The method in claim 8, further comprising placing a spacer between books in a row to correct a row that does not comply with said legal requirements.

10. The method in claim 8, further comprising always adding spacers at boundaries of pre-placed fixed objects, for any circuit row inserted between said fixed objects.

11. The method in claim 8, wherein said books comprise application-specific integrated circuit (ASIC) books of a logical function.

12. The method in claim 8, wherein a book has a first polarity if ends of said book have the same phase shift, and a second polarity if ends of said hook have different phase shifts.

13. The method in claim 8, wherein an odd or even nature of said row polarity indicates whether said row has the same or different phase shifts at ends of said row.

14. The method in claim 8, further comprising inserting a book between sub-rows to create a larger row and repeating said summing and said checking on said larger row.

15. A program storage device readable by machine, tangibly embodying a program of instructions executable by said mach Inc to perform a method for checking legality of books in a phase-shift circuit design mask, said method comprising:

arranging said hooks in rows;

determining a book polarity of each of said books;

summing polarities of said books within each of said rows to produce a row polarity; and checking whether said row polarity complies with legal requirements of said circuit design.

16. The program storage device in claim 15, wherein said method further comprises placing a spacer between books in a row to correct a row that does riot comply with said legal requirements.

17. The program storage device in claim 15, further comprising always adding spacers at boundaries of pre-placed fixed objects, for any circuit row inserted between said fixed objects.

18. The program storage device in claim 15, wherein said books comprise application-specific integrated circuit (ASIC) books of a logical function.

19. The program storage device in claim 15, wherein a book has a first polarity if ends of said book have the same phase shift, and a second polarity if ends of said book have different phase shifts.

20. The program storage device in claim 15, wherein an odd or even nature of said row polarity indicates whether said row has the same or different phase shifts at ends of said row.

* * * * *